(12) United States Patent
Oh

(10) Patent No.: US 12,444,710 B2
(45) Date of Patent: Oct. 14, 2025

(54) IMAGE SENSOR PACKAGE

(71) Applicant: Samsung Electronics Co., Ltd., Suwon-si (KR)

(72) Inventor: Seungryong Oh, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 565 days.

(21) Appl. No.: 17/843,147

(22) Filed: Jun. 17, 2022

(65) Prior Publication Data

US 2023/0129129 A1    Apr. 27, 2023

(30) Foreign Application Priority Data

Oct. 27, 2021    (KR) ........................ 10-2021-0144882

(51) Int. Cl.
*H10F 39/00*    (2025.01)
*H01L 25/065*    (2023.01)

(52) U.S. Cl.
CPC ........ *H01L 25/0655* (2013.01); *H10F 39/804* (2025.01); *H10F 39/811* (2025.01)

(58) Field of Classification Search
CPC .... H10F 39/804; H10F 39/805; H10F 39/806; H10F 39/811; H10F 39/90; H10D 44/40; H01L 21/823406
See application file for complete search history.

(56) References Cited

U.S. PATENT DOCUMENTS

| | | | |
|---|---|---|---|
| 6,982,470 B2 | 1/2006 | Omori | |
| 7,968,961 B2 | 6/2011 | Yamamoto | |
| 10,636,823 B2 | 4/2020 | Lee et al. | |
| 2006/0043555 A1 | 3/2006 | Liu | |
| 2009/0085134 A1 | 4/2009 | Park et al. | |
| 2017/0236761 A1* | 8/2017 | Hsieh | H01L 23/3114 257/680 |
| 2018/0019274 A1* | 1/2018 | Yang | H10H 20/8506 |
| 2018/0166485 A1* | 6/2018 | Park | H10F 39/806 |
| 2020/0211962 A1* | 7/2020 | Tsai | H01L 21/6835 |

FOREIGN PATENT DOCUMENTS

| | | |
|---|---|---|
| JP | 4846910 B2 | 12/2011 |
| KR | 10-2011-0077902 A | 7/2011 |
| KR | 10-2074464 | 3/2020 |

OTHER PUBLICATIONS

Korean Office Action dated Jul. 14, 2025 for corresponding Korean Patent Application No. 10-2021-0144882 and its Enlgish-language translation.

* cited by examiner

*Primary Examiner* — Steven B Gauthier
*Assistant Examiner* — Adam D Weiland
(74) *Attorney, Agent, or Firm* — Harness, Dickey & Pierce, P.L.C.

(57) ABSTRACT

An image sensor package includes an image semiconductor chip, and an image sensor in the image semiconductor chip. The package includes a dam structure on a substrate of the image semiconductor chip, and the dam structure includes a plurality of dams. The package includes a glass plate on the dam structure. A top surface of the dam structure and a bottom surface of the glass plate are on a substantially same plane, and the plurality of dams are apart from one another by one or more air gaps.

20 Claims, 10 Drawing Sheets

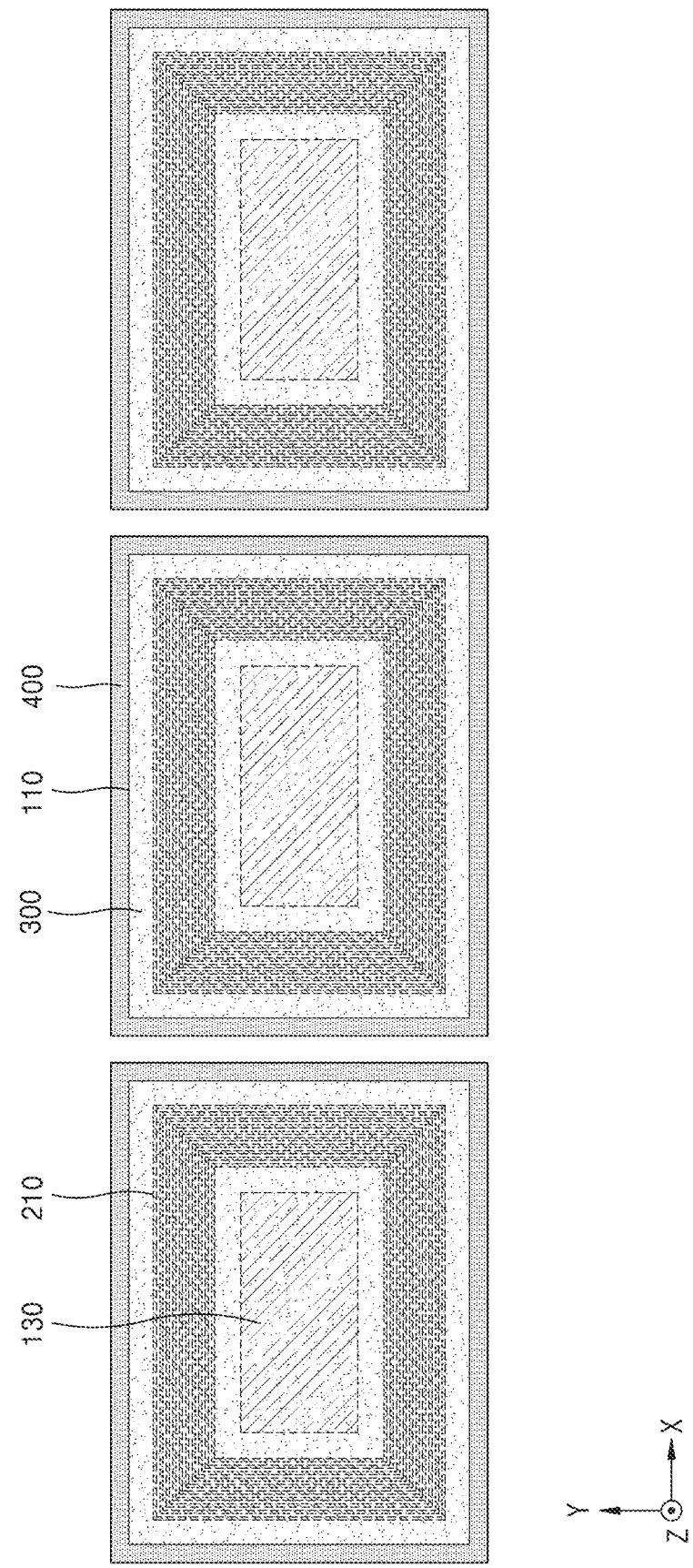

IMAGE SENSOR PACKAGE

CROSS-REFERENCE TO RELATED APPLICATION

This U.S. non-provisional patent application claims priority under 35 U.S.C. § 119 to Korean Patent Application No. 10-2021-0144882, filed on Oct. 27, 2021, in the Korean Intellectual Property Office, the disclosure of which is incorporated by reference herein in its entirety.

BACKGROUND

The inventive concepts relate to an image sensor package, and for example, to an image sensor package having a structure including a sensor unit with improved stability.

In addition to a camera, an image sensor may be used as a main component in a mobile terminal such as a mobile phone, a tablet, and a vehicle. An image sensor package may have various package structures such as chip on board (COB), chip on flexible PCB (COF), chip on glass (COG), wafer level chip scale package (WLCSP), image sensor ball grid array (IBGA), and plastic leadless chip carrier (PLCC), according to systems to be mounted in, and for example, an image sensor package used in a camera and a mobile phone may be formed to have an image sensor chip scale package (ICSP) structure.

SUMMARY

The inventive concepts may provide an image sensor package having a reduced form factor and designed to reduce or prevent penetration of an adhesive layer into a sensor unit, the image sensor package having a structure with improved stability.

According to an aspect of the inventive concepts, an image sensor package includes an image semiconductor chip, and an image sensor in the image semiconductor chip. The package includes a dam structure on a substrate of the image semiconductor chip, and the dam structure includes a plurality of dams. The package includes a glass plate on the dam structure. A top surface of the dam structure and a bottom surface of the glass plate are on a substantially same plane, and the plurality of dams are apart from one another by one or more air gaps.

According to another aspect of the inventive concepts, an image sensor package includes a redistribution layer, a semiconductor chip on the redistribution layer, and an image sensor in the semiconductor chip. A dam structure is arranged on a substrate of the image semiconductor chip, and the dam structure includes a plurality of dams. The package includes a glass plate on the dam structure, an adhesive layer surrounding the dam structure and the glass plate on the substrate, and a plurality of external connection terminals at a bottom surface of the redistribution layer. A top surface of the dam structure and a bottom surface of the glass plate are on a substantially same plane, and the plurality of dams are apart from one another by one or more air gaps.

According to another aspect of the inventive concepts, an image sensor package includes a redistribution layer, an image semiconductor chip arranged on the redistribution layer and including a through electrode, and an image sensor is in the semiconductor chip. A dam structure is on a substrate of the image semiconductor chip. The dam structure surrounds the image sensor, and includes a plurality of dams. The package includes a glass plate on the dam structure, an adhesive layer surrounding the dam structure and the glass plate on the substrate, and a plurality of external connection terminals at a bottom surface of the redistribution layer. A top surface of the dam structure and a bottom surface of the glass plate are on a substantially same plane, the top surface of the dam structure, the top surface of the substrate, and the bottom surface of the adhesive layer are on a substantially same plane, and the plurality of dams are apart from each other by an one or more air gaps.

BRIEF DESCRIPTION OF THE DRAWINGS

Example embodiments of the inventive concepts will be more clearly understood from the following detailed description taken in conjunction with the accompanying drawings in which:

FIGS. 5A, 5B, 5C and 5D illustrate a process of manufacturing an image sensor package according to an example embodiment of the inventive concepts;

DETAILED DESCRIPTION

Figure 1:
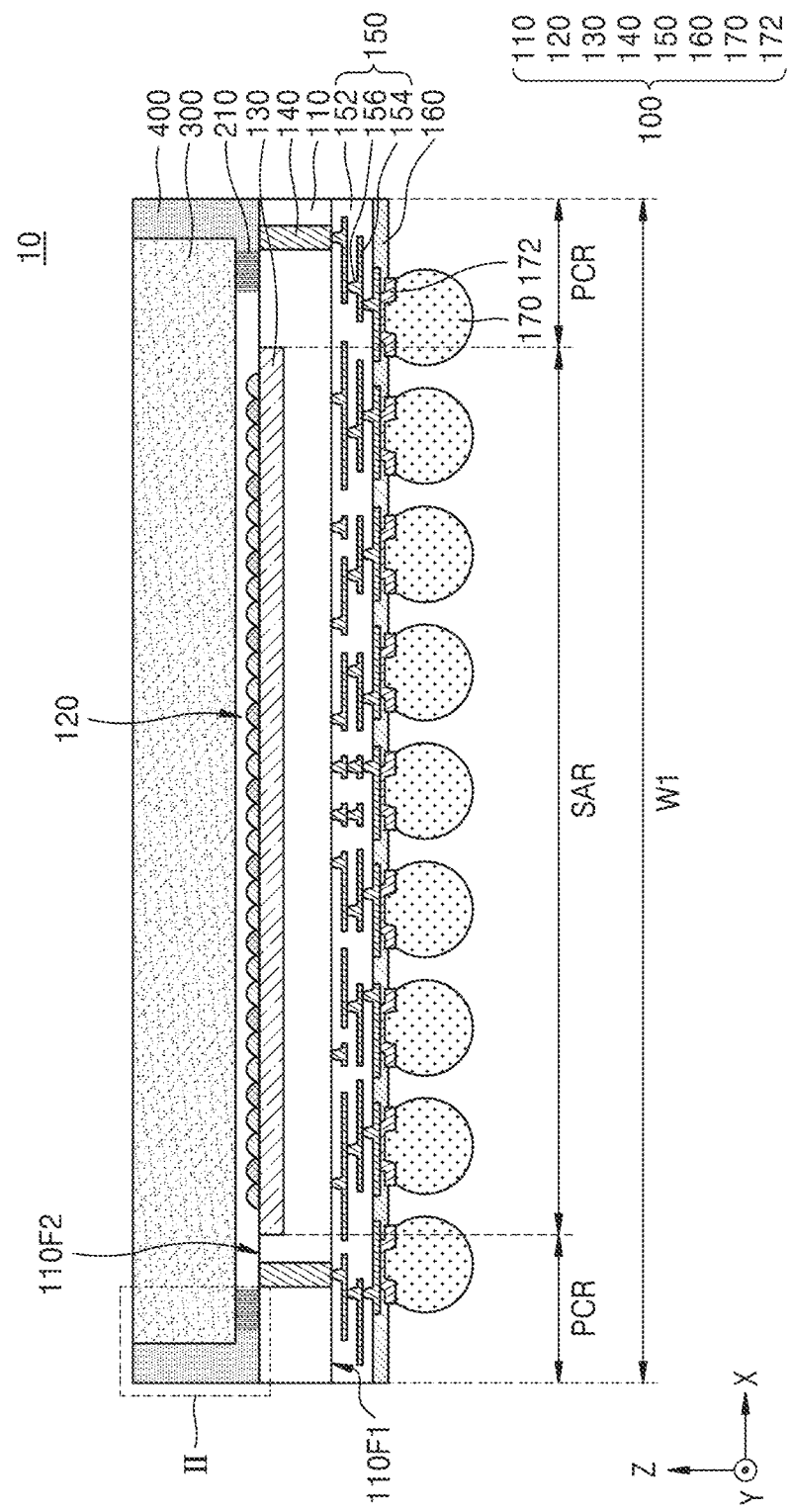
FIG. 1 is a cross-sectional view of a structure of an image sensor package according to an example embodiment of the inventive concepts.

Hereinafter, example embodiments of the inventive concepts will be described in detail with reference to the accompanying drawings. Same reference numerals may be given to same components in the drawings, and repeated description thereof may not be given.

FIG. 1 is a cross-sectional view of a structure of an image sensor package 10 according to an example embodiment of the inventive concepts.

Referring to FIG. 1, the image sensor package 10 of the example embodiment may include an image semiconductor chip 100, a plurality of dams 210, a glass plate 300, and an adhesive layer 400. In the image sensor package 10, the plurality of dams 210 may be stacked in a vertical direction (e.g., the Z direction) on a substrate 110 of the image semiconductor chip 100, and the glass plate 300 may be stacked in the vertical direction (e.g., the Z direction) on the plurality of dams 210.

The image sensor package 10 of the example embodiment may be configured such that the adhesive layer 400 may not penetrate into a sensor unit 130 of the image semiconductor chip 100, and the stability of the sensor unit 130 may be improved.

The image semiconductor chip 100 may include, for example, a complementary metal oxide semiconductor (CMOS) image sensor or a charge-coupled device (CCD).

The image semiconductor chip 100 may include the substrate 110, a microlens 120, the sensor unit 130, a through electrode 140, a redistribution layer 150, a passivation layer 160, an external connection terminal 170, and an external connection pad 172.

The image semiconductor chip 100 may include a sensor array region (SAR) and peripheral circuit region (PCR) formed in the substrate. The PCR indicates a region other than the SAR in the substrate 110 forming the image semiconductor chip 100.

The substrate 110 may include a first surface 110F1 and a second surface 110F2 facing each other. In some example embodiments, the substrate 110 may include a Group IV semiconductor material, a Group III-V semiconductor material, or a Group II-VI semiconductor material. The Group IV semiconductor material may include, for example, silicon (Si), germanium (Ge), or Si—Ge. The Group III-V semiconductor material may include, for example, gallium arsenide (GaAs), indium phosphide (InP), gallium phosphide (GaP), indium arsenide (InAs), indium antimonide (InSb), or indium gallium arsenide (InGaAs). The Group II-VI semiconductor material may include, for example, zinc telluride (ZnTe) or cadmium sulfide (CdS). Example embodiments are not limited to the above materials.

The substrate 110 may include a semiconductor substrate. For example, the substrate 110 may include a p-type silicon substrate. In some example embodiments, the substrate 110 may include a p-type bulk substrate and a p-type or n-type epitaxial layer grown thereon. In other example embodiments, the substrate 110 may include a n-type bulk substrate and a p-type or n-type epitaxial layer grown thereon. Alternatively, the substrate 110 may include an organic plastic substrate.

The substrate 110 may have a silicon on insulator (SOI) structure. For example, the substrate 110 may include a buried oxide layer (BOX). The substrate 110 may include a conductive region, for example, a well doped with an impurity or a structure doped with an impurity. In addition, the substrate 110 may have various device isolation structures such as a shallow trench isolation (STI) structure.

Although not shown in FIG. 1, the substrate 110 may include a photoelectric conversion region (not shown). The photoelectric conversion region may convert an optic signal into an electric signal. The photoelectric conversion region may include a photoelectric conversion element formed in the substrate 110. The photoelectric conversion region may include an impurity region doped with impurities having a conductive type opposite to a conductive type of the substrate 110. The photoelectric conversion region may be divided into a center region, in which the photoelectric conversion elements are arranged, and a peripheral region in which the photoelectric conversion elements are not arranged. The photoelectric conversion element may generate and accumulate photo charges in proportion to an amount of light incident from the outside, and a photodiode, a phototransistor, a photogate, a pinned photodiode (PPD), or a combination thereof may be used as the photoelectric conversion element, but example embodiments are not limited thereto.

A transmission gate (not shown) may be in the substrate 110. The transmission gate may extend from the first surface 110F1 of the substrate 110 into the substrate 110. The transmission gate may include a portion of a transmission transistor. On the first surface 110F1 of the substrate 110, for example, the following components may be formed: a transmission transistor configured to transmit a charge generated in the photoelectric conversion region to the floating diffusion region; a reset transistor configured to periodically reset the charge stored in the floating diffusion region; a drive transistor configured to function as a source follower buffer amplifier and buffer a signal according to the charge that is charged in the floating diffusion region; and a selection transistor having switching and addressing functions to select a plurality of unit pixels.

The photoelectric convert region, the transmission gate, a plurality of transistors, and the floating diffusion region may form a unit pixel. A plurality of unit pixels may be adjacent to each other and may be two-dimensionally arranged. The plurality of unit pixels may be divided into active pixels including the photoelectric conversion elements and dummy pixels that do not include the photoelectric conversion elements.

The sensor array region SAR may include a plurality of unit pixels (not shown) arranged in the form of a matrix. The peripheral circuit region PCR may be located along edges of the sensor array region SAR. Although the peripheral circuit region PCR is illustrated as located along all edges of the sensor array region SAR, the peripheral circuit region PCR is not limited thereto and may be located along one, two or three edges of the sensor array region SAR.

The plurality of unit pixels and a plurality of pads may be formed on the second surface 110F2 of the substrate 110. A plurality of color filters and a plurality of microlenses may be sequentially formed on the plurality of unit pixels.

The peripheral circuit region PCR may include a logic region (LR)(not shown) and a pad region (PR). The logic region LR may include, for example, a timing generator, a row decoder, a row driver, a correlated double sampler (CDS), an analog-to-digital converter (ADC), a latch, a column decoder, and the like, but example embodiments are not limited thereto.

A plurality of unit pixels in the sensor array region SAR may be driven by receiving, from the row driver, a plurality of driving signals such as a row selection signal, a reset signal, a charge transmission signal, and the like. In addition, an electrical output signal converted in a photoelectrical manner in the plurality of unit pixels may be provided to the CDS. The timing generator may provide a timing signal and a control signal to the row decoder and the column decoder.

The row driver may provide the plurality of driving signals for driving the plurality of unit pixels according to a result of decoding in the row decoder, and when the plurality of unit pixels are arranged in the form of a matrix, the row driver may provide the driving signal to each row in the matrix. The CDS may receive the output signal from the plurality of unit pixels, and may maintain and sample the output signal. The CDS may perform dual sampling on a certain noise level and a signal level caused by the output signal, thereby outputting a difference level corresponding to a difference between the noise level and the signal level. The ADC may convert an analog signal, which corresponds to the difference level, into a digital signal, and may output the digital signal. The latch may latch the digital signals, and the latched signals may be sequentially output according to a decoding result in the row decoder.

The unit pixel may include, for example, a passive pixel sensor or an active pixel sensor. The unit pixel may include, for example: a photodiode configured to sense light; a transfer transistor configured to transfer a charge generated by the photodiode; a reset transistor configured to periodically reset the floating diffusion region storing the transferred charge; and a source follower configured to buffer a signal according to the charge that is charged in the floating diffusion region, but example embodiments are not limited thereto.

The pad region PR may include a plurality of pads for receiving and transmitting electrical signals with an external device or a package base substrate. The pad region PR may be arranged around the sensor array region SAR. The plurality of pads formed in the pad region PR are electrically connected to the unit pixels, and are arranged along a periphery of the sensor array region SAR. The plurality of pads may include, for example, a metal, a metal nitride, or a combination thereof. Conductive distributions (not shown) and conductive plugs (not shown) configured to electrically connect the plurality of pads, electronic elements included in the logic region LR, and the plurality of unit pixels included in the sensor array region SAR are formed on the substrate 110. The conductive distributions and the conductive plugs may include, for example, a metal, a metal nitride, and a combination thereof.

The plurality of color filters may include, for example, a red (R) filter, a blue (R) filter, and a green (G) filter. Alternatively, the plurality of color filter may include a cyan (C) filter, a yellow (Y) filter, and a magenta (M) filter. One color filter from among the R filter, the B filter, and the G filter or one color filter from among the C filter, the Y filter, and the M filter is formed on each unit pixel, and each unit pixel may identify a color by sensing materials of isolated incident light. Example embodiments are not limited to these filters.

The plurality of microlenses 120 may focus incident light of the sensor array region SAR to the unit pixel. When the unit pixel includes a photodiode, the plurality of microlenses 120 may focus the incident light of the sensor array region SAR to the photodiode of the unit pixel. The microlenses 120 may include, for example, a TMR-based resin or an MFR-based resin.

Although FIG. 1 illustrates an example in which the image sensor package 10 includes twenty one microlenses 120, the number of microlenses 120 included in one image sensor package 10 may be variously modified.

The microlenses 120 may be arranged above the color filter. The microlenses 120 may be arranged to correspond to the photoelectric conversion elements PD. The microlens 120 may be transparent. For example, the microlens 120 may have a transmission rate equal to or greater than 90% with respect to light in a visible ray region. The microlens 120 may include, for example, a material such as a styrene-based resin, an acryl-based resin, a styrene-acryl polymer resin, or a siloxane-based material, but example embodiments are not limited thereto. The microlens 120 may collect the incident light, and the collected incident light may be incident to the photoelectric conversion region through the color filter. A capping layer (not shown) may be arranged above the microlens 120.

The sensor unit 130 may be formed in a portion of the second surface 110F2 of the substrate 110 and may include the unit pixel, the color filter, and/or the microlens 120. A section of the second surface 110F2 of the substrate 110 in which the sensor unit 130 is formed may be referred to as the sensor array region SAR, and a section in which the sensor unit 130 is not formed may be referred to as the peripheral circuit region PCR.

The through electrode 140 penetrating through the substrate 110 may be included in the substrate 110. The through electrode 140 may extend from the first surface 110F1 of the substrate 110 toward the second surface 110F2 of the substrate 110. The through electrode 140 may have a structure penetrating silicon of the substrate 110. For example, the through electrode 140 may be only arranged in the peripheral circuit region PCR.

The through electrode 140 may be electrically connected to the sensor unit 130. Although not shown in FIG. 1, the image sensor package 10 may include, at a bottom portion of the sensor unit 130, an additional layer for electrical connection to other components.

The through electrode 140 may include a distribution metal layer (not shown) and a barrier metal layer (not shown) surrounding the distribution metal layer. The distribution metal layer may include copper (Cu) or tungsten (W). For example, the distribution metal layer may include a Cu alloy or W alloy, but is not limited thereto.

For example, the distribution metal layer may include one or more from among aluminum (Al), gold (Au), beryllium (Be), bismuth (Bi), cobalt (Co), Cu, hydrogen fluoride (Hf), indium (In), manganese (Mn), molybdenum (Mo), nickel (Ni), lead (Pb), palladium (Pd), platinum (Pt), rhodium (Rh), rhenium (Re), ruthenium (Ru), tantalum (Ta), tellurium (Te), titanium (Ti), W, zinc (Zn), zirconium (Zr), and may include a stack structure of one or at least two of the above-mentioned materials. The barrier metal layer may include at least one material from among W, Ti, Ta, Ru, Co, Mn, or Ni, and may include a single layer or multiple layers. However, the material of the through electrode 140 is not limited to the above-mentioned materials. The barrier metal layer and the distribution metal layer may be formed through a physical vapor deposition (PVD) process or a chemical vapor deposition (CVD) process, but are not limited thereto. A spacer insulating layer (not shown) may be between the through electrode 140 and the substrate 110. The spacer insulating layer may reduce or prevent direct contact between the electronic elements in the substrate 110 and the through electrode 140. The spacer insulating layer may include an oxide film, a nitride film, a carbonate film, a polymer, or a combination thereof, but example embodiments are not limited thereto.

In some example embodiments, the CVD process may be used to form the spacer insulating layer. The spacer insulating layer may include an ozone/tetra-ethyl orthosilicate ($O_3$/TEOS)-based high aspect ratio process (HARP) oxide film formed through a sub-atmospheric CVD process.

The through electrode 140 may include any one of a via-first structure, a via-middle structure, or a via-last structure.

The redistribution layer 150 may be arranged above the first surface 110F1 of the substrate 110. In detail, the redistribution layer 150 may include an insulating layer 152, a redistribution line 154, and a conductive via 156.

The insulating layer 152 may include a conductive material, for example, a photo-imageable dielectric (PID) resin, and may further include an inorganic filler. The insulating layer 152 may include an insulating material such as silicon oxide, silicon nitride, silicon oxynitride, a low-k material, and the like, but example embodiments are not limited thereto. The insulating layer 152 may have a multi-layer structure according to a multi-layer structure of the redistribution line 154. However, for convenience, FIG. 1 illustrates the insulating layer 152 as having a single layer structure. When the insulating layer 152 has a multi-layer structure, the insulating layer 152 may include one same or substantially the same material or different materials.

The redistribution line 154 may include multiple layers that may be connected to one another by the conductive via 156. The redistribution line 154 may be electrically connected to a transistor on the first surface 110F1 of the substrate 110. The redistribution line 154 may include W, Al, Cu, tungsten silicide, titanium silicide, tungsten nitride, titanium nitride, doped polysilicon, and the like, but example embodiments are not limited thereto.

The conductive via 156 may be configured to transfer electrical signals and/or heat in the redistribution layer 150. The conductive via 156 may include a metal such as Mo, Mn, Co, tin (Sn), Ni, Mg, Re, Be, gallium (Ga), and Ru, or an alloy thereof, but is not limited thereto. The conductive via 156 and a conductive via 156 to be described later may be manufactured from a photosensitive insulating material through an exposure process and a development process.

The passivation layer 160 may be arranged on a bottom surface of the redistribution layer 150. The passivation layer 160 may cover and protect the redistribution layer 150. The passivation layer 160 may include an insulating material, for example, a resin. However, the material of the passivation layer 160 is not limited to a resin.

The external connection pads 172 may be formed above a bottom surface of the passivation layer 160, and the external connection terminals 170 may be arranged on the external connection pads 172. The external connection terminal 170 may be electrically connected to the redistribution line 154 of the redistribution layer 150. The external connection terminal 170 may be configured to connect the image sensor package 10 to a main board of an electronic device, on which the image sensor package 10 is mounted, and the like. The external connection pad 172 may include a solder ball made of a metal material including a conductive material, for example, at least one of Sn, Ag, Cu, and Al, but example embodiments are not limited thereto.

As the image semiconductor chip 100 in the present example embodiment includes a through electrode 140 penetrating through the substrate 110, and thus, a size of the image semiconductor chip 100 may be reduced. Accordingly, the size of the image sensor package 10 including the image semiconductor chip 100 may be reduced to improve spatial efficiency of the image sensor package 10.

The image sensor package 10 in the present example embodiment may include a dam structure 200 arranged in the vertical direction (e.g., the Z direction) on the peripheral circuit region PCR of the substrate 110. Although the dam structure 200 is illustrated as including ten dams 210, the number of dams 210 is not limited thereto. For example, the dam structure 200 may include nine or less dams 210, or may include eleven or more dams 210.

The dam structure 200 may include a thermally conductive material. In addition, the dam structure 200 may include an insulating material. The dam structure 200 may include, for example, an insulating material such as a photo-imageable dielectric (PID) resin and polyimide, a semi-conductive material such as Si, a conductive material such as a metal, and the like.

A width W2 (see FIG. 2) of the dam 210 may indicate a distance between two opposite sides of one dam 210. The width W2 (see FIG. 2) of the dam 210 may be in a range from about 5 μm to about 50 μm, but is not limited thereto. The width W2 (see FIG. 2) of the dam 210 may vary according to components of the dam 210.

The dam structure 200 may include the plurality of dams 210. The plurality of dams 210 may be apart from one another in a first horizontal direction (e.g., the X direction) and a second horizontal direction (e.g., the Y direction) and arranged on the substrate 110. As described above, the dam structures 200 may be arranged in the vertical direction (e.g., the X direction) on the peripheral circuit region PCR of the substrate 110.

A distance between the first horizontal direction (e.g., the X direction) and the second horizontal direction (e.g., the Y direction) of the plurality of dams 210 may be in a range from about 5 μm to about 50 μm, but is not limited thereto.

The distance between the plurality of dams 210 in the first horizontal direction (e.g., the X direction) and the second horizontal direction (e.g., the Y direction) may vary according to the materials of the dam structure 200.

For example, the dam structure 200 may include ten to fifteen dams 210. A shape of the dam 210 will be described in detail with reference to FIG. 3. Therefore, a width W3 (see FIG. 3) of the dam structure 200 may be in a range from about 50 μm to about 150 μm, but is not limited thereto.

For example, with reference to the width W1 in the first horizontal direction (e.g., the X direction) of the image semiconductor chip 100, a ratio of the width W3 (e.g., see FIG. 3) of the dam structure 200 may be in a range of from about 1.5% to about 3.5%. In another example embodiment, with reference to the width W2 in the second horizontal direction (e.g., the Y direction) of the image semiconductor chip 100, a ratio of the width W3 (see FIG. 3) of the dam structure 200 may be in a range of from about 1.5% to about 3.5%.

A general image sensor package includes a dam structure including a single dam, and an adhesive layer may penetrate into the sensor array region SAR in the first horizontal direction (e.g., the X direction) and/or the second horizontal direction (e.g., the Y direction), and then into the microfilter, the unit pixel, and/or the color filter of the sensor unit. Accordingly, the image sensor package may be less reliable.

The image sensor package 10 of the present example embodiment, which includes the plurality of dams 210 apart from one another in the first horizontal direction (e.g., the X direction) and the second horizontal direction (e.g., the Y direction), separates the adhesive layer 400 and the sensor unit 130 from each other, thereby protecting the microlens 120, the unit pixel and/or the color filter of the sensor unit 130 from the adhesive layer 400. Accordingly, the image sensor package 10 of the present example embodiment may include the sensor unit 130 having relatively higher reliability.

The glass plate 300 may be arranged on the sensor array range SAR of the image semiconductor chip 100 and configured to filter certain materials of incident light entering the sensor unit 130. However, the glass plate 300 may be arranged apart by a certain distance from the microlens 120.

For example, the glass plate 300 may include a transparent material capable of having light, which is for forming an image, enter the sensor unit 130. The glass plate 300 may include an infrared ray (IR) cut-off filter (IRCF) and/or IR blue glass (or blue filter).

As a CMOS image sensor (CIS) or a CCD mounted in a mobile phone, a notebook computer and/or a camera system may include the glass plate 300 blocking infrared rays, natural colors may be provided to the sensor unit 130.

According to another example embodiment of the inventive concepts, the glass plate 300 may be replaced with a film filter including a film material. However, the material of the glass plate 300 is not limited thereto and may be configured such that the light for image forming is incident on the sensor array region SAR of the sensor unit 130, and the glass plate 300 may include other materials capable of sealing the sensor unit 130.

A horizontal area of the glass plate 300 may be greater than a horizontal area of the sensor unit 130 and smaller than a horizontal area of the image semiconductor chip 100. In addition, the horizontal area of the glass plate 300 may be greater than a horizontal area occupied by an internal space that is defined by an outer surface 200O (see FIG. 3) of the dam structure 200. That is, in the first horizontal direction (e.g., the X direction) and the second horizontal direction (e.g., the Y direction), the dam structure 200 may be in the glass plate 300. Accordingly, each of the outer surfaces 200O (see FIG. 3) of the dam structure 200 may not be aligned in the vertical direction (e.g., the Z direction) of a side surface of the glass place 300, and may be in the glass plate 300 in the first horizontal direction (e.g., the X direction) and the second horizontal direction (the Y direction).

In addition, a bottom surface of the glass plate 300 may be on a surface that is substantially identical to a top surface of the dam structure 200. Accordingly, the glass plate 300 and the image semiconductor chip 100 may be connected to each other through the dam structure 200.

The adhesive layer 400 may be configured to block foreign materials such that the foreign materials are not in contact with the sensor unit 130. In addition, the adhesive layer 400 may be configured such that the dam structure 200 and the glass plate 300 on the image semiconductor chip 100 adhere to each other with a relatively strong adhesion. For example, after the adhesive layer 400 in a liquid state is coated on the substrate 110, the adhesive layer 400 may be cured, and the adhesive layer 400 in a solid state may be formed.

The adhesive layer 400 may be arranged at the outside of the outer surface 200O (see FIG. 3) of the dam structure 200. A bottom surface of the adhesive layer 400 may be on a substantially same plane as a top surface of the substrate 110 and a bottom surface of the dam structure 200. In addition, a lower portion of the top surface 400 of the adhesive layer 400 may be on a substantially same plane as the bottom surface of the glass plate 300 and the top surface of the dam structure 200. In addition, the top surface of the adhesive layer 400 may include a linear surface having a uniform vertical level.

Figure 2:
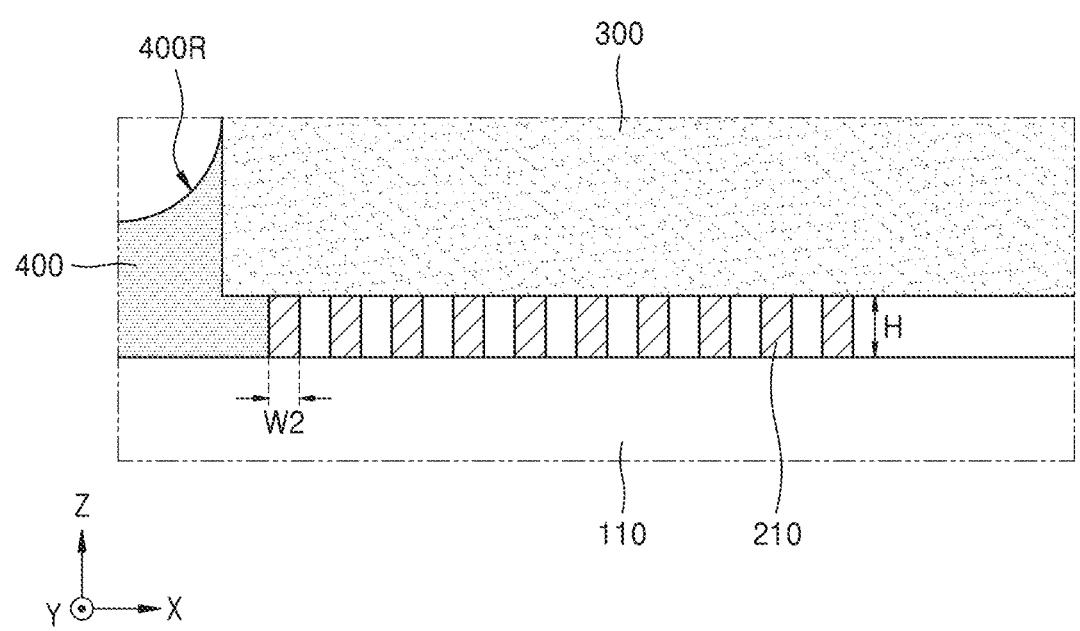
FIG. 2 is a cross-sectional view showing a combination relationship of a substrate, a dam, and a glass plate, according to an example embodiment of the inventive concepts.

Although FIG. 1 illustrates the top surface of the adhesive layer 400 as a linear surface having a uniform vertical level, referring to FIG. 2, the top surface 400R may be curved.

In the image sensor package 10 of the present example embodiment, a peripheral space of the sensor array region SAR of the sensor unit 130 may be sealed by the glass plate 300 and/or the adhesive layer 400, and the stability of the sensor unit 130 may be improved. In particular, as the adhesive layer 400 may not penetrate into the sensor array region SAR, the stability of the image sensor package 10 may be improved.

In addition, as the dam structure 200 includes the plurality of dams 210, the adhesive layer 400 may not penetrate into the dam structure 200. In addition, even when the adhesive layer 400 penetrates into the dam structure 200, the adhesive layer 400 may not penetrate into the sensor array region SAR.

In addition, as described above, the image sensor package 10 of the present example embodiment includes the glass plate 300 and the through electrode 140, and the size of the image sensor package 10 may be relatively reduced.

Although not shown in FIG. 1, a package base substrate may be attached to the bottom surface of the image sensor package 10. In some example embodiments, the package base substrate may include a printed circuit board (PCB). For example, the package base substrate may include a multi-layer PCB.

According to an example embodiment of the inventive concepts, the image sensor package 10 may include a wafer level package (WLP), or may include a fan-out wafer level package (FOWLP), in which a package connection terminal or an external connection pad also exists at the outside of a semiconductor chip region, or a fan-in wafer level package (FIWLP) in which a package connection terminal or an external connection pad only exists in the semiconductor chip region.

For example, the image sensor package 10 may include a chip-last fan-out package in which an interposer or a package base substrate is first formed and then at least one semiconductor chip is mounted on the interposer or the package base substrate. In other example embodiments, the image sensor package 10 may have a chip-first structure in which at least one semiconductor chip is mounted on a tape, a periphery region of the semiconductor chip is surrounded by a molding layer, and then an interposer or a package base substrate is connected to the semiconductor chip. In some example embodiments, the image sensor package 10 may include a fan-out panel level package (FOPLP).

For example, the image sensor package 10 may include a plurality of semiconductor chips, and may include a system in package (SIP) in which different kinds of semiconductor chips are electrically connected to one another and operate as one system.

FIG. 2 is a cross-sectional view of a combination relationship of the substrate 110, the dam 210, and the glass plate 300 according to an example embodiment of the inventive concept.

Referring to FIGS. 1 and 2, the substrate 110 and the glass plate 300 may be connected to each other through the dam 210. As described above, FIG. 2 illustrates an example embodiment in which one image sensor package 10 includes ten dams 210, but the number of dams 210 included in one image sensor package 10 may be variously modified.

For convenience of explanation, FIG. 2 only illustrates the peripheral circuit region PCR of the substrate 110. FIG. 2 is a cross-sectional view of a square portion II marked with broken lines in FIG. 1.

The plurality of dams 210 may be arranged apart from one another in the first horizontal direction (e.g., the X direction) and the second horizontal direction (e.g., the Y direction). Although FIG. 2 illustrates an example embodiment in which the dams 210 are separate from one another at uniform intervals in the first horizontal direction (e.g., the X direction) and the second horizontal direction (e.g., the Y direction), a distance between the plurality of dams 210 may be variously modified. According to an example embodiment of the inventive concepts, a distance between the dams 210 in the first horizontal directions (e.g., the X direction) and the second horizontal direction (e.g., the Y direction) may be in a range from about 5 μm to about 50 μm. A distance between the plurality of dams 210 on a horizontal surface may vary according to the materials of the dam 210. For example, a resolution of the materials of the dam 210 may be equal to the distance between the dams 210 in the first horizontal direction (e.g., the X direction) and the second horizontal direction (e.g., the Y direction). In another example embodiment, the width W2 of the dam 210 may be equal to the distance by which the dams 210 are apart from each other. That is, the dams 210 may be apart from one another by an air gap.

A height H of the dam structure 200 may be substantially identical to a distance in the vertical direction (e.g., the Z direction) between the glass plate 300 and the substrate 110. That is, the top surface of the dam structure 200 and the bottom surface of the glass substrate 300 may be on a substantially same surface, and the bottom surface of the dam structure 200 and the top surface of the substrate 110 may be on a substantially same surface. The height H of the dam structure 200 may be in a range from about 5 μm to about 50 μm, but is not limited thereto. The height H of the dam structure 200 may vary according to the material of the dam 210. For example, the resolution of the material of the dam 210 may be identical to the height H of the dam structure 200.

The width W2 of the dam 210 may be in a range from about 5 μm to about 50 μm, but is not limited thereto. The width W2 of the dam 210 may vary according to the components of the dam 210. For example, the resolution of the material of the dam 210 may be identical to the width W2 of the dam 210.

In addition, on the substrate 110, the adhesive layer 400 may be arranged on the outer surface 200O (see FIG. 3) of the dam structure 200 and at the outside of a side surface of the glass plate 300. Although not shown in FIG. 2, a portion of the adhesive layer 400 may penetrate into the dam structure 200. However, in the image sensor package 10 of the present example embodiment, as the adhesive layer 400 is not arranged in an innermost-angle surface 200I (see FIG. 3) of the dam structure 200, the adhesive layer 400 may not penetrate into the sensor array region SAR. Accordingly, the reliability of the image sensor package 10 may be improved.

Referring to FIG. 2, the top surface 400R of the adhesive layer 400 may be curved. In a process in which the adhesive layer 400 is coated in a liquid state and cured, a portion of the adhesive layer 400 being in contact with the glass plate 300 may maintain a height of the adhesive layer 400 in the vertical direction (e.g., the Z direction). On the contrary, a portion of the adhesive layer 400 not being contact with the glass plate 300 may not maintain the height of the adhesive layer 400 in the vertical direction (e.g., the Z direction), and therefore, the top surface 400R of the adhesive layer 400 may be curved.

Figure 3:
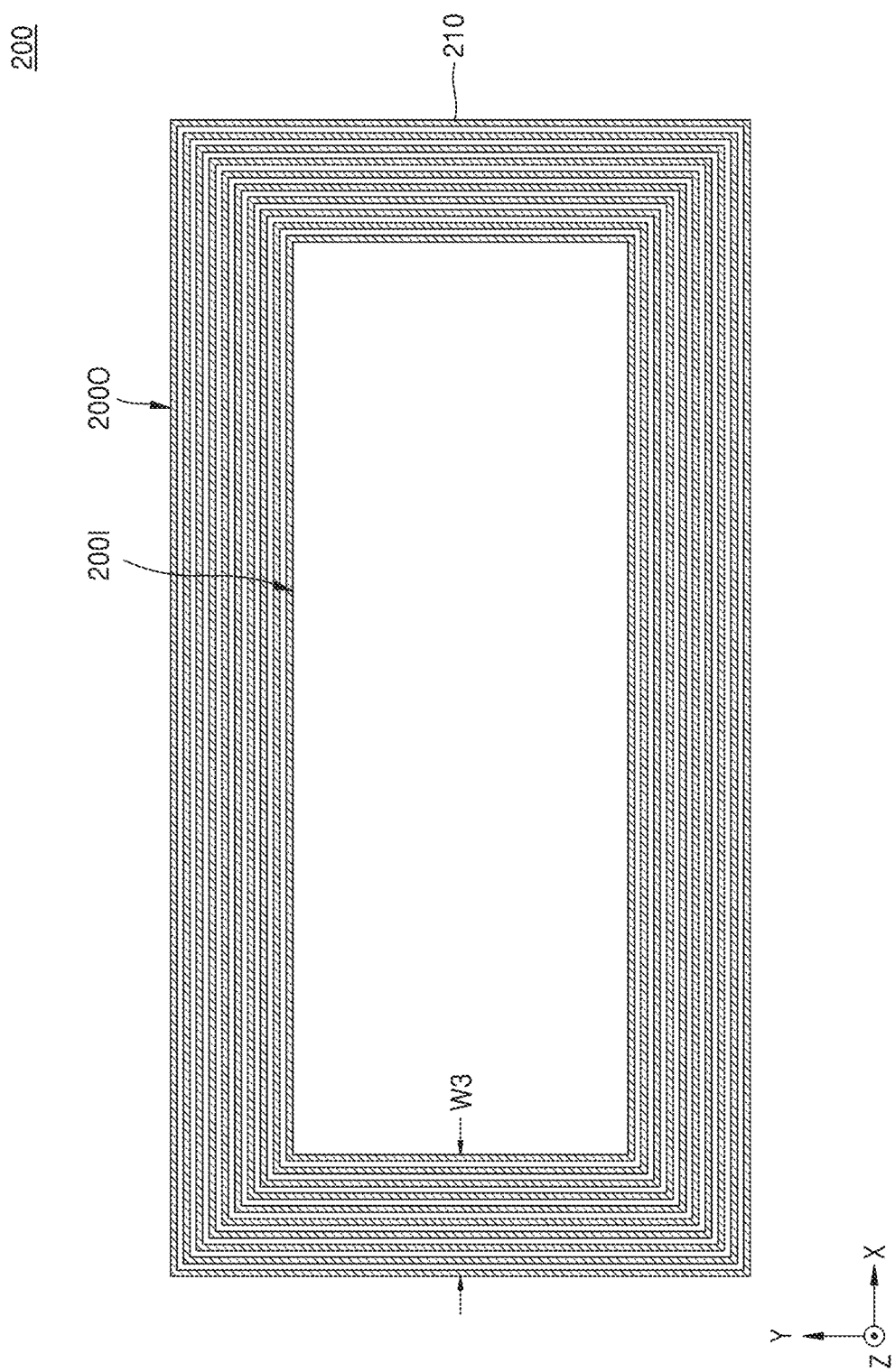
FIG. 3 is a top-plan view of a dam structure according to an example embodiment of the inventive concepts.

FIG. 3 is a top-plan view of the dam structure 200 according to an example embodiment of the inventive concepts.

Referring to FIG. 3, the dam structure 200 may include ten dams 210. As described above, the number of dams 210 included in the dam structure 200 may be variously modified. Although FIG. 3 illustrates an example embodiment in which a cross-section of the dam 210 has a rectangular shape, the shape of the cross-section of the dam 210 may be variously modified.

In addition, with reference to the first horizontal direction (e.g., the X direction) or the second horizontal direction (e.g., the Y direction), a smallest value from among distances from the outer surface 200O of the dam structure 200 to the inner surface 200I of the dam structure 200 may be defined as the width W3 of the dam structure 200. The width W3 of the dam structure 200 may be in a range from about 100 μm to about 150 μm, but is not limited thereto. The width W3 of the dam structure 200 may be variously modified according to the material of the dam 210. In addition, according to the horizontal area of the image semiconductor chip 100, the width W3 of the dam structure 200 may be variously modified.

As described above, the sensor array region SAR may be arranged in the inner surface defined by the innermost-angular surface 200I of the dam structure 200.

Figure 4:
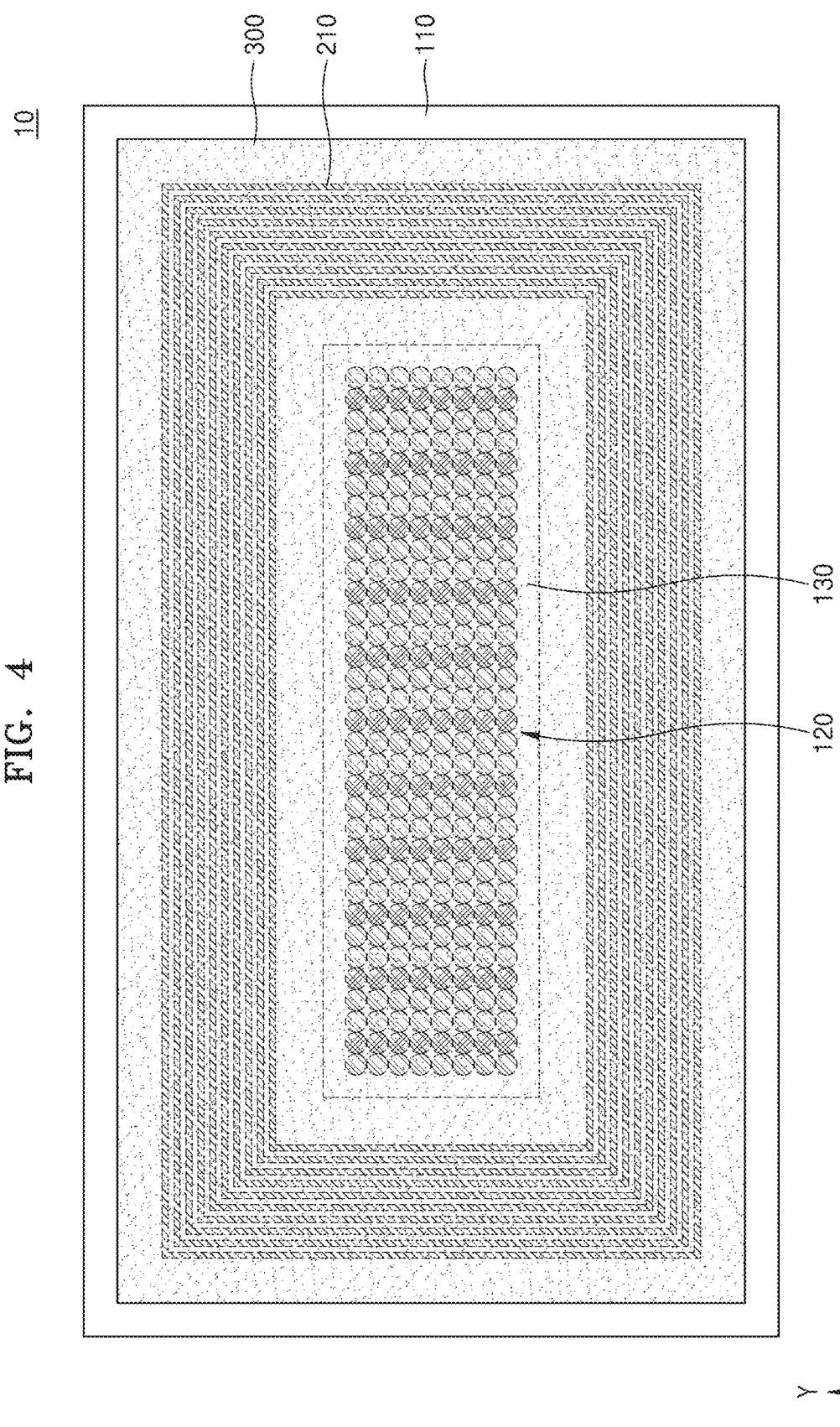
FIG. 4 is a top-plan view of an image sensor package according to an example embodiment of the inventive concepts.

FIG. 4 is a top-plan view of the image sensor package 10 according to an example embodiment of the inventive concepts.

In FIG. 4, a portion marked with broken lines indicates a portion that is not directly seen in the top-plan view.

Referring to FIG. 4, the image sensor package 10 may include the substrate 110, the sensor unit 130, the microlens 120 arranged on the sensor unit 130 with reference to the vertical direction (e.g., the Z direction), the dam structure 200 apart from the microlens 120 in the horizontal direction, and the glass plate 300 arranged on the dam structure 200.

In addition, the substrate 110 may have a largest horizontal area, and the sensor unit 130 may have a smallest horizontal area.

Although FIG. 4 illustrates an example in which twenty one microlenses 120 are arranged in the first horizontal direction (e.g., the X direction) and eight microlenses 120 are arranged in the second direction (e.g., the Y direction) on the sensor unit 130, the number of microlenses 120 arranged in the first horizontal direction (e.g., the X direction) and/or the second horizontal direction (e.g., the Y direction) may be variously modified. In addition, as described above, the number of dams 210 included in the dam structure 200 may be variously modified.

FIGS. 5A to 5D illustrate a process of manufacturing the image sensor package 10 according to an example embodiment of the inventive concepts.

Figure 5A:
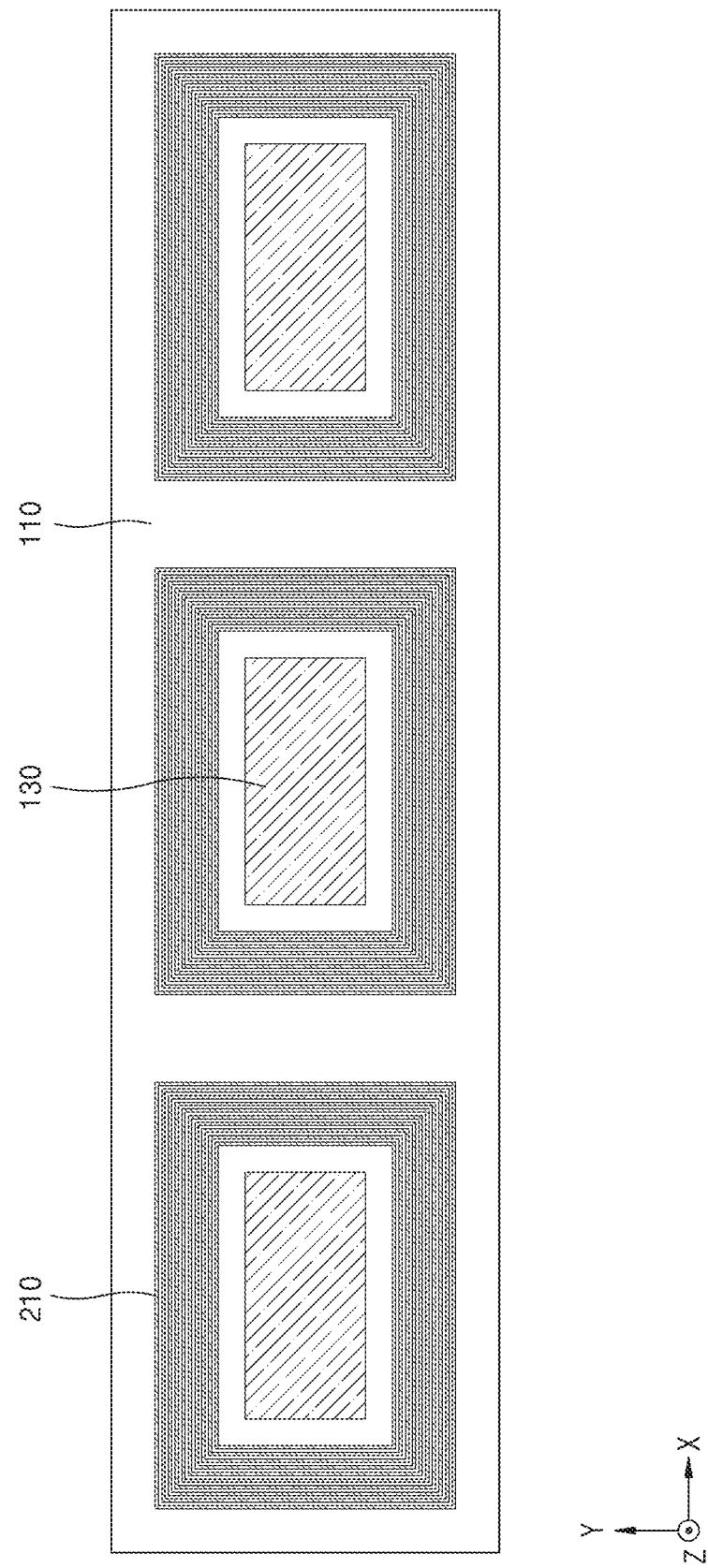

Referring to FIG. 5A, first, the sensor unit 130 and the dam structure 200 may be arranged on the substrate 110.

As described above, the dam structure 200 may be arranged to surround the sensor array region SAR in which the sensor unit 130 is arranged. A distance between horizontal surfaces of the dam structure 200 and the sensor unit 130 may be variously modified.

Although FIG. 5A illustrates the dam structure 200 including ten dams 210, the number of dams 210 may be variously modified.

Figure 5B:
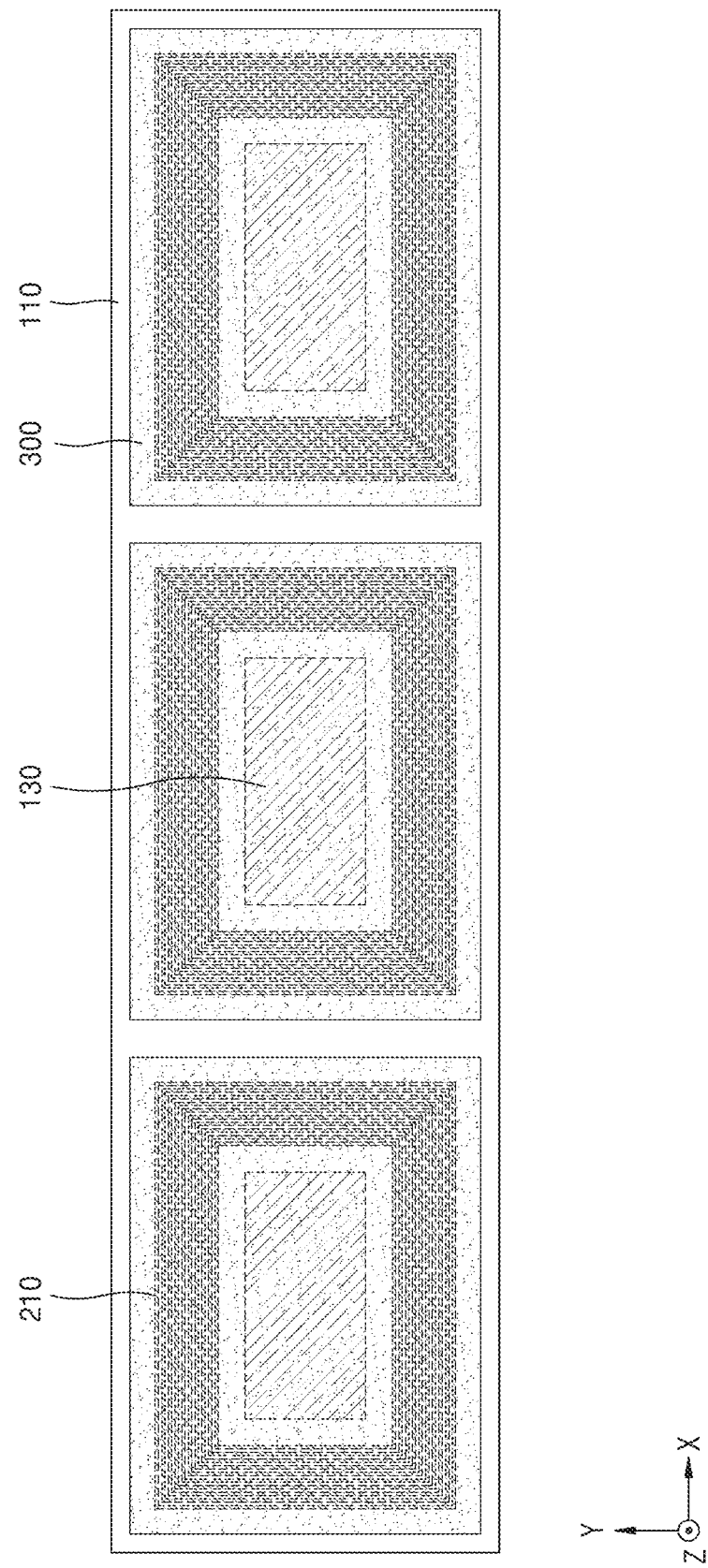

Referring to FIG. 5B, the glass plate 300 may be arranged on the dam structure 200. Accordingly, the top surface of the dam structure 200 and the bottom surface of the glass plate 300 may be on a substantially same plane.

Figure 5C:
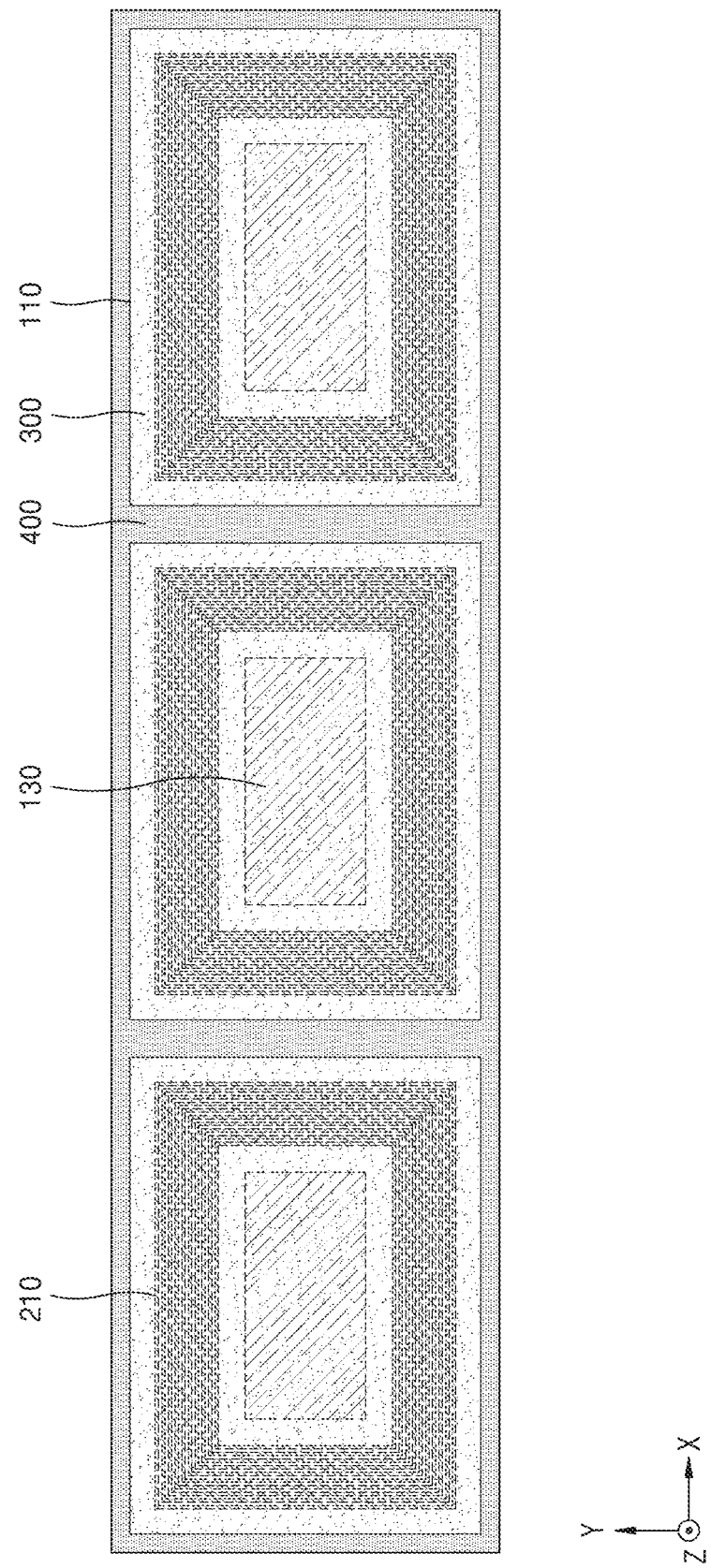

Referring to FIG. 5C, the adhesive layer 400 may be formed on a side surface of the glass plate 300. In addition, the adhesive layer 400 may be arranged at the outside of the outer surface 200O (see FIG. 3) of the dam structure 200. The adhesive layer 400 may protect the sensor array region SAR such that foreign materials do not penetrate into the sensor array region SAR.

Referring to FIG. 5D, the image sensor package 10 of the present example embodiment may be formed by sawing into individual units with reference to the image semiconductor chip 100.

According to an example embodiment of the inventive concepts, the image sensor package 10 may be formed by a chip-on-wafer (CoW) method of arranging the image semiconductor chip 100 on the wafer.

Figure 6:
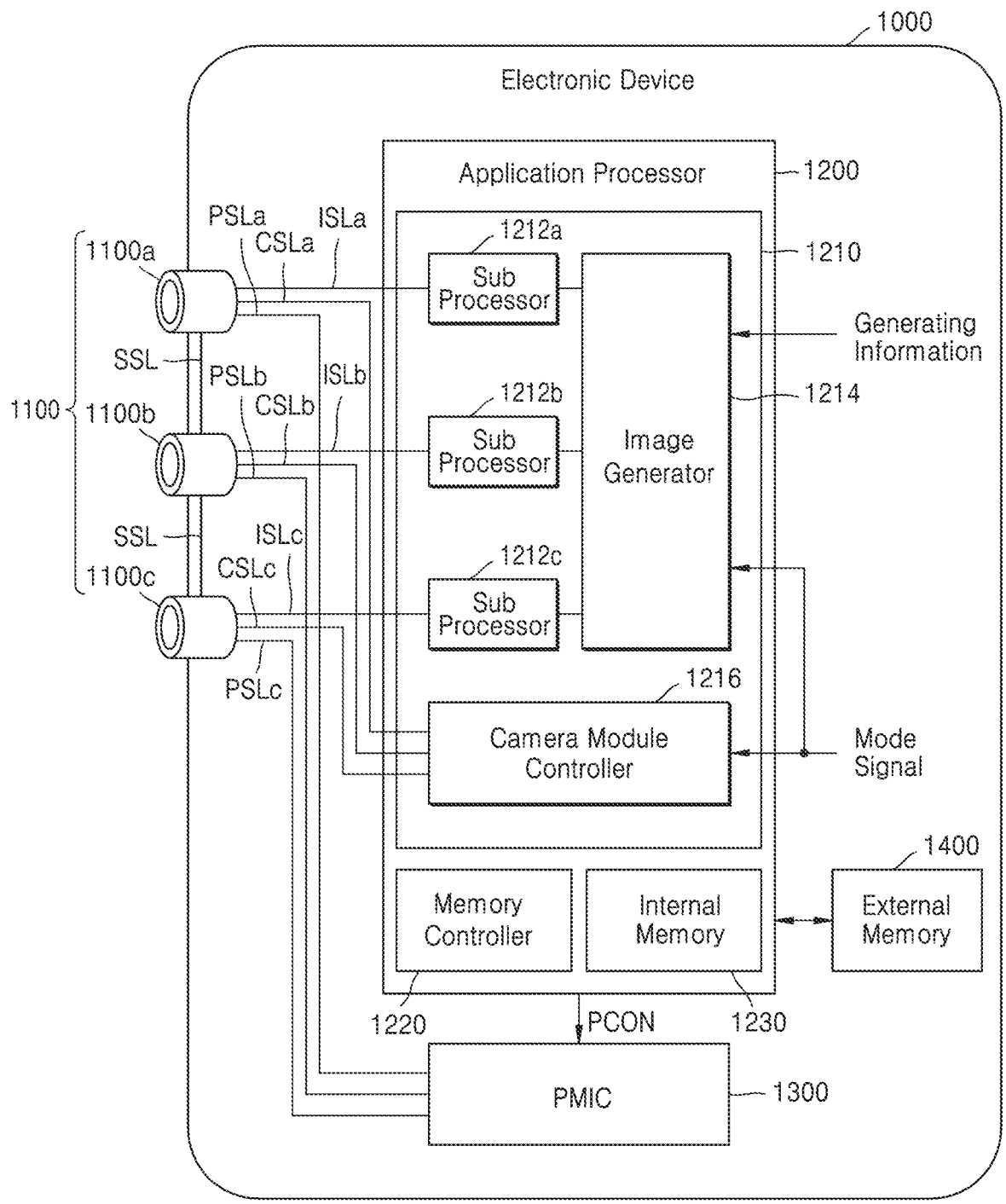
FIG. 6 is a block diagram of an electronic device including a multi camera module.
Figure 7:
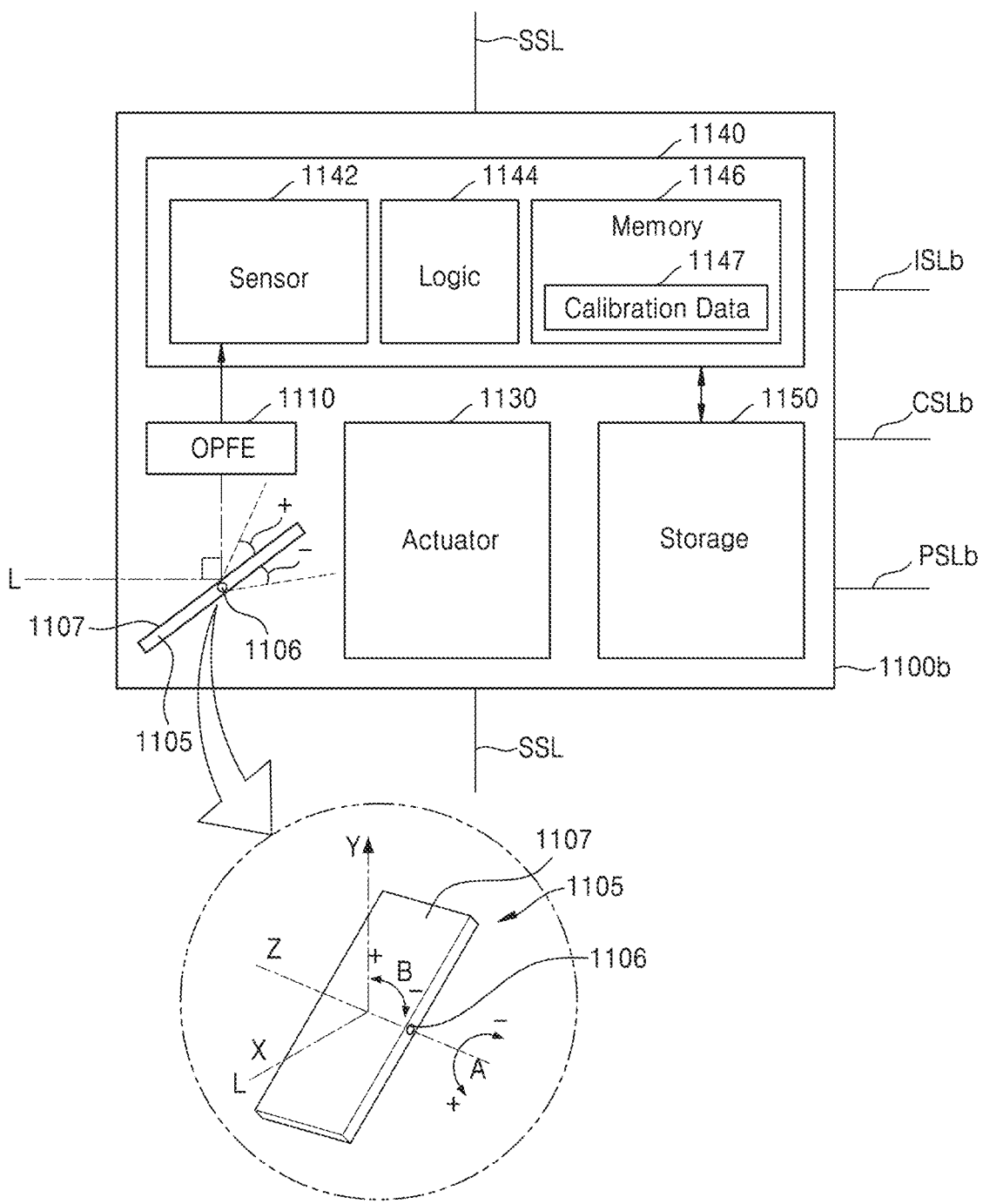
FIG. 7 is a detailed block diagram of the multi camera module shown in FIG. 6.

FIG. 6 is a block diagram of an electronic device including a multi camera module; and FIG. 7 is a detailed block diagram of the multi camera module shown in FIG. 6.

Referring to FIG. 6, the electronic device 1000 may include a camera module group 1100, an application processor 1200, a power management integrated circuit (PMIC) 1300, and a storage 1400.

The camera module group 1100 may include a plurality of camera module groups 1100a, 1100b, and 1100c. Although FIG. 6 illustrates an example embodiment in which three camera modules 1100a, 1100b, and 1100c are arranged, example embodiments are not limited thereto. In some example embodiments, the camera module group 1100 may be modified to include only two camera modules or include n (where n is a natural number equal to or greater than four) camera modules.

Hereinafter, a detailed configuration will be described in further detail with reference to FIG. 7, but the following description may also be applied to other camera modules 1100a and 1100c according to example embodiments.

Referring to FIG. 7, the camera module 1100b may include a prism 1105, an optical path folding element (hereinafter, referred to as OPFE 1110), an actuator 1130, an image sensing device 1140, and a storage 1150.

The prism 1105, which includes a reflective surface 1107 of a light reflecting material, may change a path of light L incident from the outside.

In some example embodiments, the prism 1105 may change a path of the light L incident in the first horizontal direction (e.g., the X direction) into the second horizontal direction (e.g., the Y direction) that is perpendicular to the first horizontal direction (e.g., the X direction). In addition, the prism 1105 may rotate the reflective surface 1107 of a light reflecting material in an A direction about a central axis 1106 or rotate the central axis 1106 in a B direction, thereby changing the path of the light L incident in the first direction (e.g., the X direction) into the second horizontal direction (e.g., the Y direction) that is perpendicular to the first horizontal direction (the X direction). In some example embodiments, the OPFE 1110 may also move in the first horizontal direction (e.g., the X direction) and the third direction (e.g., the Z direction) that is perpendicular to the second horizontal direction (e.g., the Y direction).

As shown in some example embodiments, a rotation angle of the prism 1105 (e.g., a maximum rotation angle) may be equal to or smaller than 15° in a positive (+) A direction and may be greater than 15° in a negative (−) A direction, but the example embodiments are not limited thereto.

In some example embodiments, the prism 1105 may move by about 20°, from about 10° to about 20°, or from about 15° to about 20° in a positive (+) or negative (−) B direction. Here, the prism 1105 may move in the positive (+) or negative (−) B direction by a same angle or by similar angles within a tolerance of about 1 degree. Example embodiments are not limited to the above angle ranges.

In some example embodiments, the prism 1105 may move the reflective surface 1107 of the light reflecting material in the third direction (for example, the Z direction) that is parallel to a direction in which the central axis 1106 extends.

The OPFE 1110 may include, for example, a group of m (where m is a natural number) optical lenses. The m optical lenses may move in the second horizontal direction (e.g., the Y direction) and may change an optical zoom ratio of the camera module 1100b. For example, under assumption that a basic optical zoom ratio of the camera module 1100b is Z, when the m optical lenses included in the OPFE 1110 are moved, the optical zoom ratio of the camera module 1100b may be changed into an optical zoom ratio of 3 Z, 5 Z, or equal to or greater than 5 Z, but example embodiments are not limited thereto.

The actuator 1130 may move the OPFE 1110 or the optical lens to certain positions. For example, for accurate sensing, the actuator 1130 may adjust a position of the optical lens such that the image sensor 1142 is within a focal length of the optical lens.

The image sensing device 1140 may include an image sensor 1142, a control logic 1144, and a memory 1146. The image sensor 1142 may sense an image of a sensing object by using the light L provided through the optical lens. The control logic 1144 may control overall operations of the camera module 1100b. For example, the control logic 1144 may control operations of the camera module 1100b in response to a control signal provided through a control signal line CSLb.

The memory 1146 may store information such as calibration data 1147 for operations of the camera module 1100b. The calibration data 1147 may include information for the camera module 1100b to generate image data by using the light L provided from the outside. The calibration data 1147 may include, for example, information about a degree of rotation, information about a focal length, and information about an optical axis described above. When the camera module 1100b is implemented in the form of a multi-state camera which has a focal length changing according to the position of the optical lens, the calibration data 1147 may include information about a focal length value for each position (or for each state) of the optical lens and auto focusing.

The storage 1150 may store image data sensed through the image sensor 1142. The storage 1150 may be at the outside of the image sensing device 1140, and may be implemented as the form of being stacked with a sensor chip included in the image sensing device 1140. In some example embodiments, the storage 1150 may be implemented as an electrically erasable programmable read-only memory (EEPROM), but the example embodiments are not limited thereto.

Referring to FIGS. 6 and 7, in some example embodiments, each of the plurality of camera modules 1100a, 1100b, and 1100c may include an actuator 1130. Accordingly, the plurality of camera modules 1100a, 1100b, and 1100c may respectively include same or different pieces of the calibration data 1147 according to operations of the actuators 1130 included in the plurality of camera modules 1100a, 1100b, and 1100c.

In some example embodiments, one (for example, the camera module 1100b) of the plurality of camera modules 1100a, 1100b, and 1100c may include a folded-lens type camera module including the prism 1105 and the OPFE 1110, and other camera modules (for example, the camera modules 1100a and 1100c) may include a vertical type camera module that does not include the prism 1105 and the OPFE 1110, but the example embodiments are not limited thereto.

In some example embodiments, one (for example, the camera module 1100c) of the plurality of camera modules 1100a, 1100b, and 1100c may include, for example, a vertical type depth camera configured to extract depth information by using infrared ray (IR). In some example embodiments, the application processor 1200 may merge image data provided from the depth camera and image data provided from another camera module (for example, the camera module 1100a or the camera module 1100b) to generate a three-dimensional (3D) depth image.

In some example embodiments, at least two camera modules (for example, the camera module 1100a and the camera module 1100b) from among the plurality of camera modules 1100a, 1100b, and 1100c may respectively have different fields of view. In this case, for example, at least two camera modules (for example, the camera module 1100a and the camera module 1100b) from among the plurality of camera modules 1100a, 1100b, and 1100c may have different camera modules, but the example embodiments are not limited thereto.

Furthermore, in some example embodiments, the plurality of camera modules 1100a, 1100b, and 1100c may have different fields of view. In this case, the optical lenses included in the plurality of camera modules 1100a, 1100b, and 1100c may also be different from one another, but the example embodiments are not limited thereto.

In some example embodiments, the plurality of camera modules 1100a, 1100b, and 1100c may be arranged physically apart from one another. That is, the plurality of camera modules 1100a, 1100b, and 1100c may not divide a sensing region of one image sensor 1142 for use, but an independent image sensor 1142 may be arranged in each of the plurality of camera modules 1100a, 1100b, and 1100c.

Referring again to FIG. 6, the application processor 1200 may include an image processing device 1210, a memory controller 1220, and an internal memory 1230. The application processor 1200 may be implemented separate from the plurality of camera modules 1100a, 1100b, and 1100c. For example, the application processor 1200 and the plurality of camera modules 1100a, 1100b, and 1100c may be separately implemented as individual semiconductor chips.

The image processing device 1210 may include a plurality of sub image processors 1212a, 1212b, and 1212c, an image generator 1214, and a camera module controller 1216.

The image processing device 1210 may include a number of the plurality of sub image processors 1212a, 1212b, and 1212c corresponding to the number of the plurality of camera modules 1100a, 1100b, and 1100c.

Image data generated from each of the camera modules 1100a, 1100b, and 1100c may be provided to corresponding sub image processors 1212a, 1212b, and 1212c through image signal lines ISLa, ISLb, and ISLc separated from one another. For example, the image data generated from the camera module 1100a is provided to the sub image processor 1212a through the image signal line ISLa, the image data generated from the camera module 1100b is provided to the sub image processor 1212b through the image signal line ISLb, and the image data generated from the camera module 1100c may be provided to the sub image processor 1212c through the image signal line ISLc. Such image data transmission may be performed, for example, by using a Mobile Industry Processor Interface (MIPI)-based camera serial interface (CSL), but the example embodiments are not limited thereto.

In some example embodiments, one sub image processor may be arranged to correspond to a plurality of camera modules. For example, the sub image processor 1212a and the sub image processor 1212c may not be implemented separate from each other as shown in FIG. 6, but may be implemented as an integrated sub image processor, and the image data provided from the camera module 1100a and the camera module 1100c may be selected through a selection element (for example, a multiplexer) and the like and then provided to the integrated sub image processor.

The image data provided to each of the plurality of sub image processors 1212a, 1212b, and 1212c may be provided to the image generator 1214. The image generator 1214 may generate an output image by using the image data provided from each of the plurality of sub image processors 1212a, 1212b, and 1212c, in response to image generating information or mode signals.

In detail, the image generator 1214 may merge at least some of the image data generated from the plurality of camera modules 1100a, 1100b, and 1100c having different fields of views to generate the output image, in response to the image generating information or the mode signals. In addition, the image generator 1214 may select any one piece of the image data generated from the camera modules 1100a, 1100b, and 1100c having different fields of view to generate the output image, in response to the image generating information or the mode signals.

In some example embodiments, the image generating information may include zoom signals or zoom factors. Furthermore, in some example embodiments, the mode signals may include signals based on modes selected by a user.

When the image generating information includes the zoom signal (e.g., the zoom factor) and the plurality of camera modules 1100a, 1100b, and 1100c have respectively different fields of views, the image generator 1214 may perform different operations according to a type of the zoom signal. For example, when the zoom signal is a first signal, the image generator 1214 may merge the image data output from the camera module 1100a and the image data output from the camera module 1100c, and then may generate the output image by using the merged image signal and the image data output from the camera module 1100b that is not used for merging. When the zoom signal is a second signal different from the first signal, the image generator 1214 may not perform such image data merge, and may select any one piece of the image data output from the plurality of camera modules 1100a, 1100b, and 1100c to generate the output data. However, the example embodiments are not limited thereto, and a method of processing the image data may be performed in various modifications.

In some example embodiments, the image generator 1214 may receive pieces of image data having different exposure time periods from at least one of the plurality of sub image processors 1212a, 1212b, and 1212c, and may generate merged image data having an increased dynamic range by performing a high dynamic range (HDR) process with respect to the pieces of image data.

The camera module controller 1216 may provide a control signal to each of the camera modules 1100a, 1100b, and 1100c. The control signal generated from the camera module controller 1216 may be provided to corresponding camera modules 1100a, 1100b, and 1100c through the control signal lines CSLa, CSLb, and CSLc separated from one another.

Any one of the plurality of camera modules 1100a, 1100b, and 1100c may be designated as a master camera module (for example, the camera module 1100b) according to image generating information including the zoom signal or the mode signal, and the remaining camera modules (for example, the camera module 1100a and the camera module 1100c) may be designated as slave cameras. Such information may be included in the control signals and may be provided to corresponding camera modules 1100a, 1100b, and 1100c through the control signal lines CSLa, CSLb, and CSLc separated from one another.

According to the zoom factor or an operation mode signal, the camera modules operating as the master camera and the slave cameras may be changed. For example, when a field of view of the camera module 1100a is wider than a field of view of the camera module 1100b and the zoom factor has a low zoom ratio, the camera module 1100b may operate as the master camera, and the camera module 1100a may operate as the slave camera. On the contrary, when the zoom factor has a high zoom ratio, the camera module 1100a may operate as the master camera, and the camera module 1100b may operate as the slave camera.

In some example embodiments, the control signals provided from the camera module controller 1216 to the plurality of camera modules 1100a, 1100b, and 1100c may include a sync enable signal. For example, when the camera module 1100b is the master camera and the camera modules 1100a and 1100c are the slave cameras, the camera module controller 1216 may transmit the sync enable signal to the camera module 1100b. The camera module 1100b which received the sync enable signal generates a sync signal on the basis of the received sync enable signal, and may provide the generated sync signal to the camera modules 1100a and 1100c through a sync signal line SSL. The camera module 1100b and the camera modules 1100a and 1100c may be synchronized to the sync signal and transmit the image data to the application processor 1200.

In some example embodiments, the control signal provided from the camera module controller 1216 to the plurality of camera modules 1100a, 1100b, and 1100c may include mode information according to the mode signals. Based on such mode information, the plurality of camera modules 1100a, 1100b, and 1100c may operate in a first operation mode and a second operation mode in relation to sensing rates.

In the first operation mode, the plurality of camera modules 1100a, 1100b, and 1100c may generate an image signal at a first rate (for example, generates an image signal at a first frame rate) and encode the image signal at a second rate that is higher than the first rate (for example, encodes an image signal at a second frame rate that is higher than the first frame rate), and may transmit the encoded image signal to the application processor 1200. In some example embodiments, the second rate may be thirty times the first rate or less.

The application processor 1200 may store the received image signal, e.g., the encoded image signal, in a memory 1230 provided in the image processor 1200 or a storage 1400 at the outside of the application processor 1200, read the encoded image signal from the memory 1230 or the storage 1400 and decode the image signal, and then display image data that is generated on the basis of the decoded image signal. For example, a corresponding sub processor from among the plurality of image processors 1212a, 1212b, and 1212c in the image processing device 1210 may perform decoding and perform image processing with respect to the decoded image signal.

In the second operation mode, the plurality of camera modules 1100a, 1100b, and 1100c may generate an image signal at a third rate lower than the first rate (for example, generate an image signal at a third frame rate that is lower than the first frame rate) and may transmit the image signal to the application processor 1200. The image signal provided to the application processor 1200 may include a signal that is not encoded. The application processor 1200 may perform image processing with respect to the received image signal or store the image signal in the memory 1230 or the storage 1400.

The PMIC 1300 may provide power, for example, a power voltage, to each of the plurality of camera modules 1100a, 1100b, and 1100c. For example, under control of the application processor 1200, the PMIC 1300 may provide first power to the camera module 1100a through a power signal line PSLa, provide second power to the camera module 1100b through a power signal line PSLb, and provide third power to the camera module 1100c through a power signal line PSLc.

The PMIC 1300 may generate power corresponding to each of the plurality of camera modules 1100a, 1100b, and 1100c in response to a power control signal PCON from the application processor 1200, and may adjust a level of the power. The power control signal PCON may include a power adjustment signal for each operation mode of the plurality of camera modules 1100a, 1100b, and 1100c. For example, the operation mode may include a low power mode, and in some example embodiments, the power control signal CON may include information about a camera module operating in a low power mode and power level that is set. Levels of the power provided to the plurality of camera modules 1100a, 1100b, and 1100c may be identical to or different from one another. In addition, the level of the power may be dynamically changed.

One or more of the elements disclosed above may include or be implemented in one or more processing circuitries such as hardware including logic circuits; a hardware/software combination such as a processor executing software; or a combination thereof. For example, the processing circuitries more specifically may include, but are not limited to, a central processing unit (CPU), an arithmetic logic unit (ALU), a digital signal processor, a microcomputer, a field programmable gate array (FGPA), a System-on-Chip (SoC), a programmable logic unit, a microprocessor, application-specific integrated circuit (ASIC), etc. Any of the memories described herein may be a non-transitory computer readable medium and may store a program of instructions. Any of the memories described herein may be a nonvolatile memory, such as a flash memory, a phase-change random access memory (PRAM), a magneto-resistive RAM (MRAM), a resistive RAM (ReRAM), or a ferro-electric RAM (FRAM), or a volatile memory, such as a static RAM (SRAM), a dynamic RAM (DRAM), or a synchronous DRAM (SDRAM).

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

While the inventive concepts have been particularly shown and described with reference to example embodiments thereof, it will be understood that various changes in form and details may be made therein without departing from the spirit and scope of the following claims.

What is claimed is:

1. An image sensor package comprising:
   an image semiconductor chip, and an image sensor in the image semiconductor chip;
   a dam structure on a substrate of the image semiconductor chip, the dam structure comprising a plurality of dams; and
   a glass plate on the dam structure,
   wherein a top surface of the dam structure and a bottom surface of the glass plate are on a substantially same plane,
   a bottom surface of the dam structure is on and in contact with an upper surface of the substrate of the image semiconductor chip, and
   the plurality of dams are apart from one another by one or more air gaps.

2. The image sensor package of claim 1, wherein a vertical side surface of an outermost dam of the plurality of dam of the dam structure is not aligned with a side surface of the glass plate in a vertical direction, and the vertical side surface is in the glass plate on a first horizontal plane and a second horizontal plane.

3. The image sensor package of claim 1, wherein a top surface of the substrate and the bottom surface of the dam structure are on a substantially same plane.

4. The image sensor package of claim 1, wherein, in a top-plan view, the dam structure is apart from the image sensor by a certain distance in a horizontal direction, and surrounds all side surfaces of the image sensor.

5. The image sensor package of claim 1, wherein a number of the plurality of dams is in a range from ten to fifteen.

6. The image sensor package of claim 1, wherein the dam structure comprises a photo-imageable dielectric (PID) resin.

7. The image sensor package of claim 1, wherein the image sensor package is a wafer level package (WLP).

8. An image sensor package comprising:
a redistribution layer;
a semiconductor chip on the redistribution layer, and an image sensor in the semiconductor chip;
a dam structure on a substrate of the semiconductor chip, the dam structure comprising a plurality of dams;
a glass plate on the dam structure;
an adhesive layer surrounding the dam structure and the glass plate on the substrate; and
a plurality of external connection terminals at a bottom surface of the redistribution layer,
wherein a top surface of the dam structure and a bottom surface of the glass plate are on a substantially same plane,
a bottom surface of the dam structure is on and in contact with an upper surface of the substrate of the semiconductor chip, and
the plurality of dams are apart from one another by one or more air gaps.

9. The image sensor package of claim 8, wherein a portion of a top surface of the adhesive layer comprises a curved surface including a lowermost surface and an uppermost surface.

10. The image sensor package of claim 8, wherein a side wall of the adhesive layer is in contact with the dam structure and the glass plate.

11. The image sensor package of claim 8, wherein a top surface of the substrate, the bottom surface of the adhesive layer, and the bottom surface of the dam structure are on a substantially same plane.

12. The image sensor package of claim 9, wherein the lowermost surface of the curved surface of the top surface of the adhesive layer, the top surface of the dam structure, and the bottom surface of the glass plate are on a substantially same plane.

13. The image sensor package of claim 8, wherein the adhesive layer is at an outside of the dam structure.

14. An image sensor package comprising:
a redistribution layer;
an image semiconductor chip on the redistribution layer and comprising a through electrode, wherein an image sensor is in the image semiconductor chip;
a dam structure on a substrate of the image semiconductor chip, the dam structure surrounding the image sensor, and comprising a plurality of dams;
a glass plate on the dam structure;
an adhesive layer surrounding the dam structure and the glass plate on the substrate; and
a plurality of external connection terminals at a bottom surface of the redistribution layer,
wherein a top surface of the dam structure and a bottom surface of the glass plate are on a substantially same plane, and
wherein a bottom surface of the dam structure, a top surface of the substrate, and a bottom surface of the adhesive layer are on a substantially same plane,
the bottom surface of the dam structure is on and in contact with an upper surface of the substrate of the image semiconductor chip, and
the plurality of dams are apart from each other by one or more air gaps.

15. The image sensor package of claim 14, wherein a width between two of the plurality of dams is in a range from about 5 μm to about 50 μm.

16. The image sensor package of claim 14, wherein a width of at least one of the plurality of dams is in a range from about 5 μm to about 50 μm.

17. The image sensor package of claim 14, wherein a height of at least one of the plurality of dams is identical to a width of at least one of the plurality of dams.

18. The image sensor package of claim 14, wherein a ratio of a width of the dam structure to a width of the image semiconductor chip is in a range from 1.5% to 3.5%.

19. The image sensor package of claim 14, wherein a width of the dam structure is in a range from about 100 μm to about 150 μm.

20. The image sensor package of claim 14, wherein a width of at least one of the plurality of dams is equal to a distance between two dams of the plurality of dams.

* * * * *